United States Patent [19]

Flora et al.

[11] Patent Number: 4,675,905
[45] Date of Patent: Jun. 23, 1987

[54] MULTIPLE INPUT SILENT AUDIO SWITCH

[75] Inventors: Jay L. Flora, Boulder; David A. Haycock, Lakewood, both of Colo.

[73] Assignee: Ampex Corporation, Redwood City, Calif.

[21] Appl. No.: 722,923

[22] Filed: Apr. 12, 1985

[51] Int. Cl.$^4$ ............................................. G09B 5/04
[52] U.S. Cl. ...................................... 381/81; 381/94; 381/119; 200/DIG. 34
[58] Field of Search ........................... 381/81, 119, 94; 200/DIG. 34; 455/8, 52, 133

[56] References Cited

U.S. PATENT DOCUMENTS

| 3,493,681 | 2/1970 | Richards | 381/81 |
| 4,259,742 | 3/1981 | Burns | 381/94 |
| 4,306,114 | 12/1981 | Callahan | 381/119 |
| 4,448,074 | 5/1984 | Schmidt | 381/94 |
| 4,493,102 | 1/1985 | Weishaupt | 381/94 |
| 4,525,820 | 6/1985 | Enoki | 381/81 |

Primary Examiner—Gene Z. Rubinson
Assistant Examiner—L. C. Schroeder
Attorney, Agent, or Firm—George B. Almeida; Joel D. Talcott

[57] ABSTRACT

A silent audio switch provides switching between multiple audio sources while eliminating the "pop" caused by switching spikes. Two internal buses are used for each visible external bus, whereby a new audio signal is first switched to an off-air bus opposite an on-air bus, any switching spike is allowed to subside, and then a fast mix is made between the two buses to derive the new audio signal as the switch output signal.

21 Claims, 5 Drawing Figures

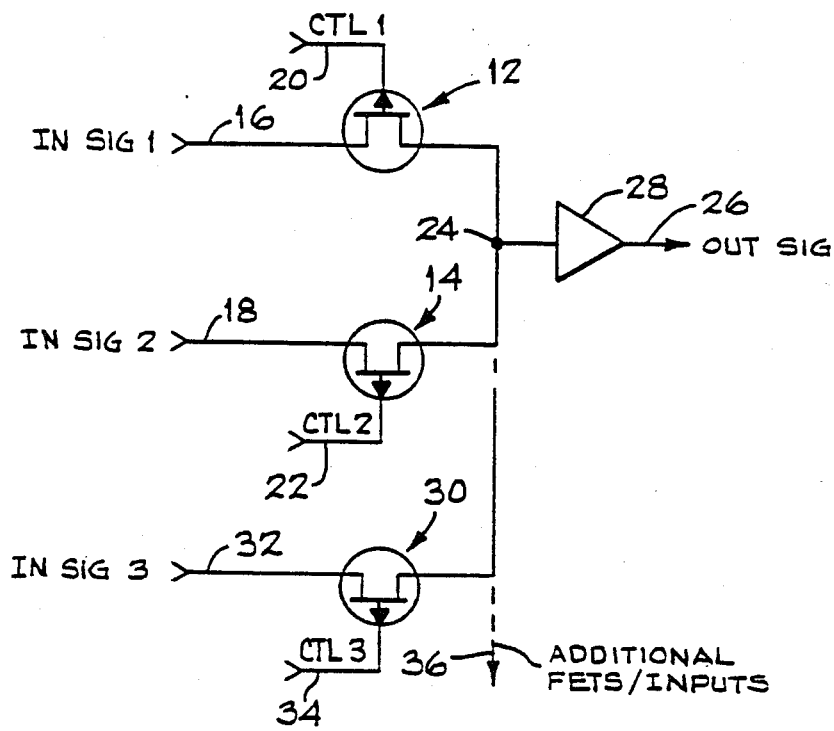
FIG_1 (PRIOR ART)
(A) IN SIG 1 
(B) IN SIG 2 
(C) CTL 1 
(D) CTL 2 
(E) OUT SIG 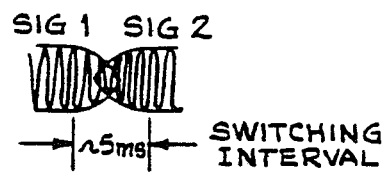
FIG_2 (PRIOR ART)

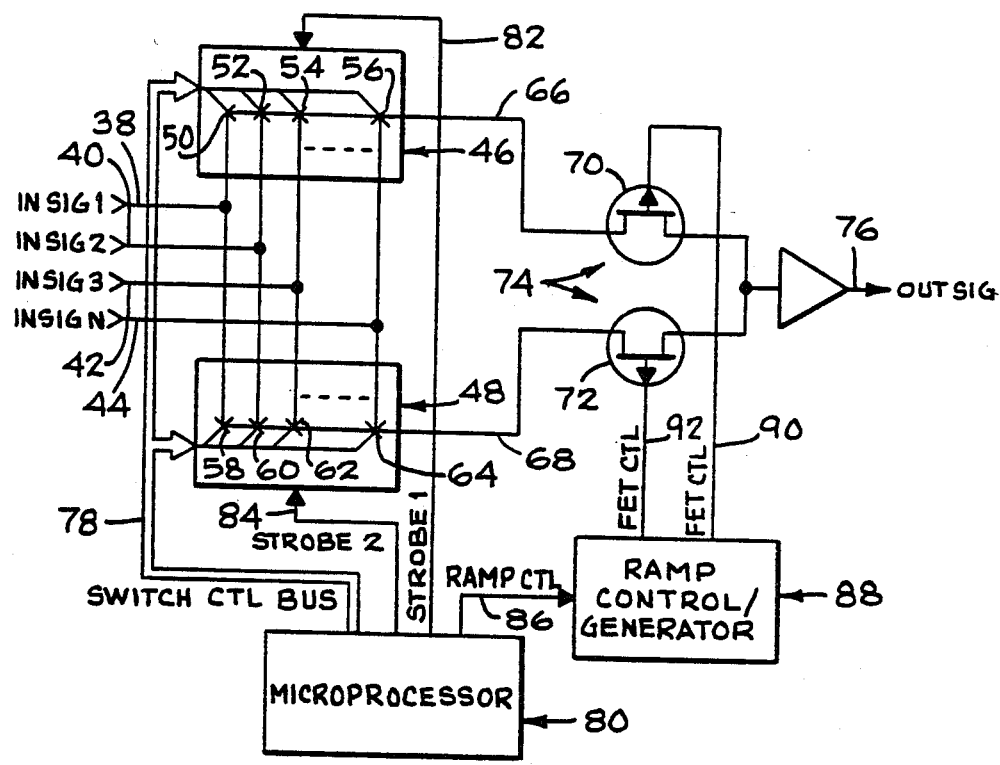
FIG_3

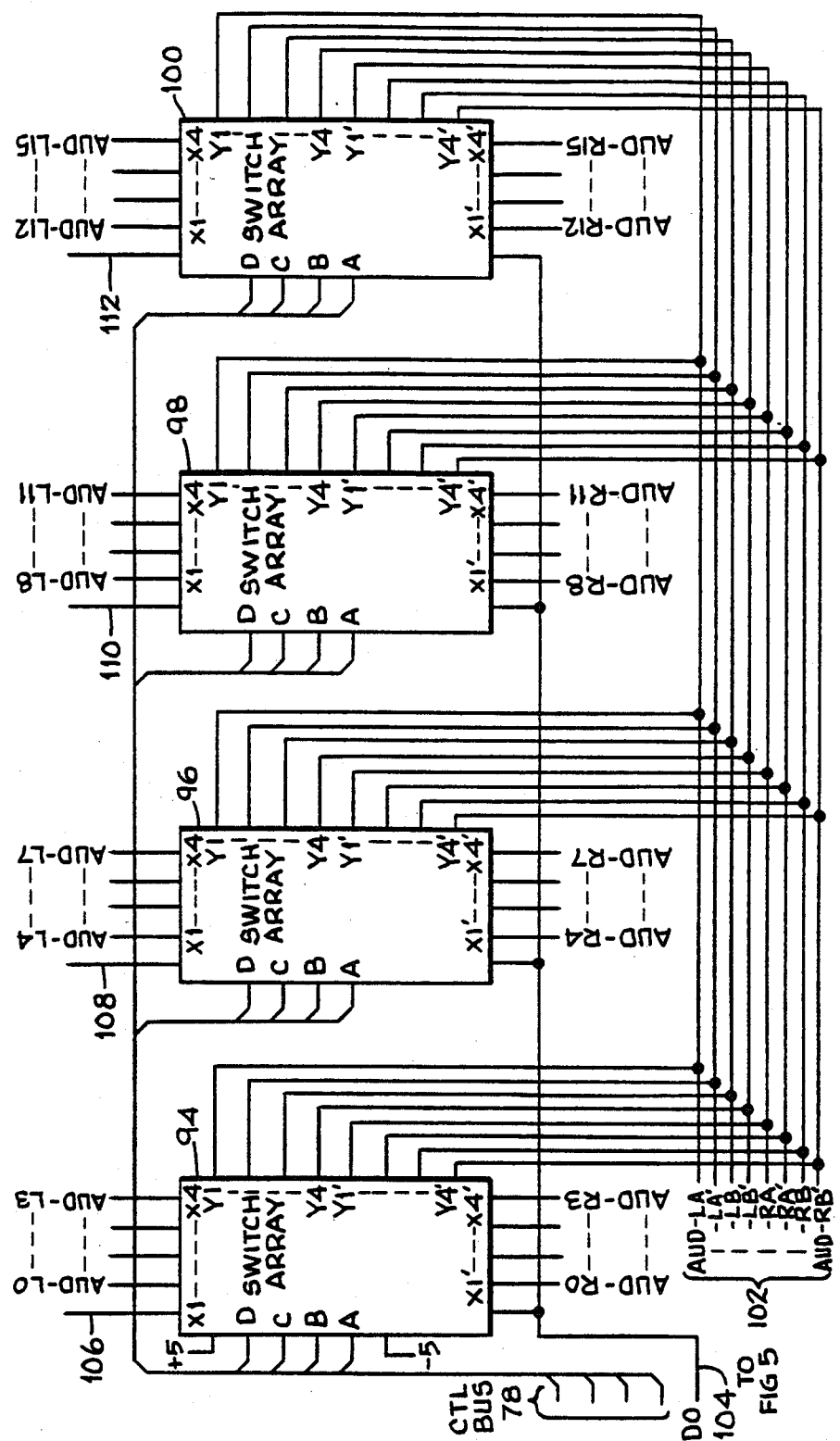

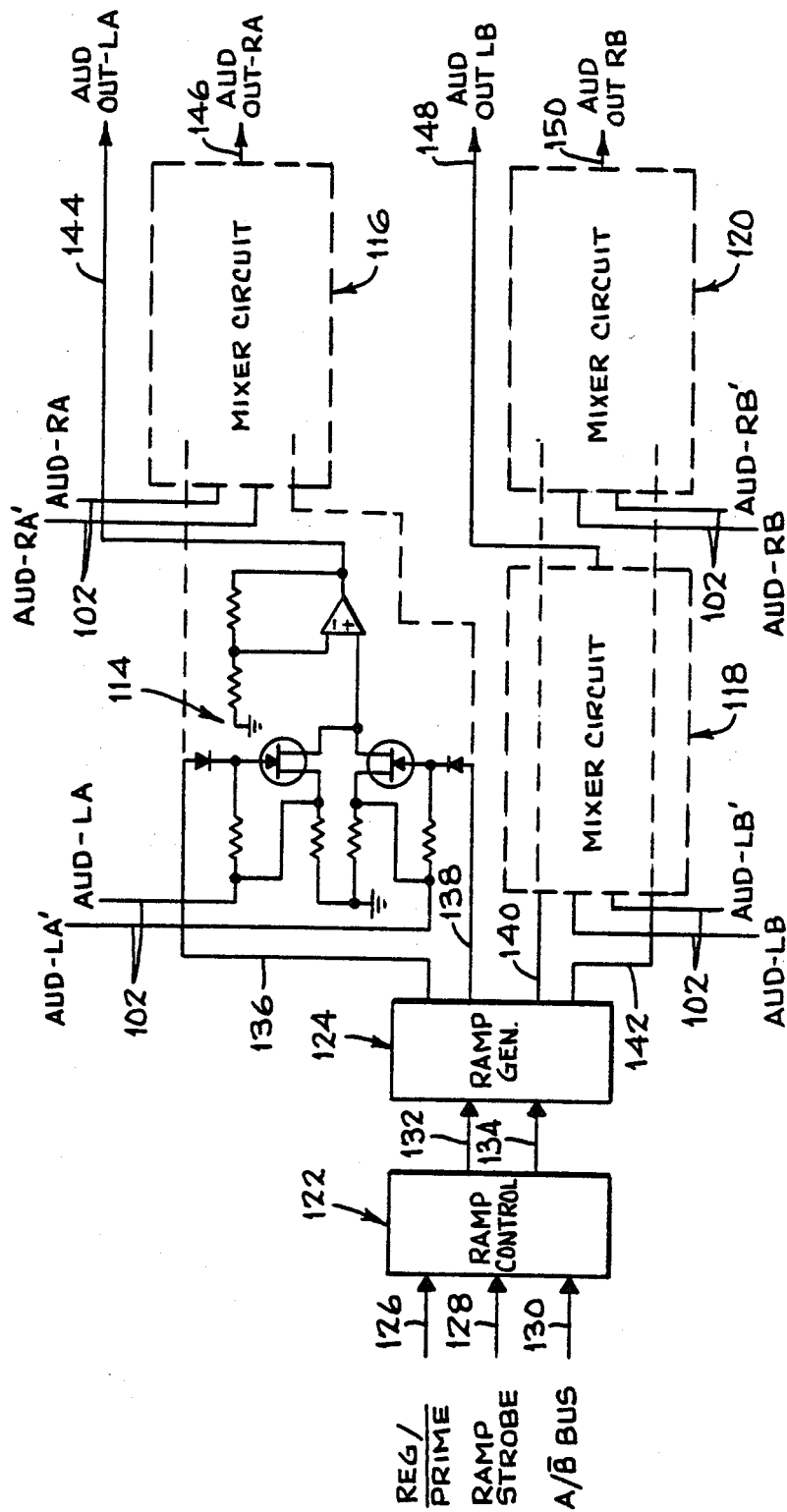
FIG_5

4,675,905

MULTIPLE INPUT SILENT AUDIO SWITCH

BACKGROUND AND SUMMARY OF THE INVENTION

The present invention relates to means for switching between multiple signal sources, and in particular to a silent audio switch employing large switch arrays with built-in decoders in combination with a fast mixer circuit, to provide audio switching without causing audible pops.

In general, typical analog switchers such as those employed in video switcher apparatus to switch between as many as 32, or more, audio signal sources, generate switching spikes which can overload following audio stages, causing the well-known problem of switching noise, or "pops". The switching spikes are caused by switching during non-zero values of the input signal waveform, for example, by switching between two high quality audio signals of different magnitudes, and by the switch's drive signal coupling through its capacitance to the output. Since very high quality stereo audio is becoming increasingly popular in the television field, switching noise generated, for example, by switcher apparatus is totally unacceptable.

Typical of present schemes for eliminating such transient spikes when switching between high quality audio signals is the technique of increasing the switch driver's transition time to reduce the transient current through the switch capacitance. Thus, in switches where the input of the switch element is available, the transition time of the driver may be tailored to any value, making silent audio switching possible. Such switches generally employ a field effect transistor (FET) as the switching element in the respective audio signal path, and provide a relatively slow switch control signal, i.e., a ramp signal, to the FET. However, such schemes generally require a prohibitive amount of discrete circuitry since large switch array devices usually do not allow access to the control signal input of the respective switching element.

A more sophisticated scheme presently in use employs a matched pair of FETs for receiving respective audio signals, which are coupled together at their outputs to define a fast FET signal mixer configuration which mixes the two audio signals during a switching time interval. The switch drive voltage fed to the FETs is selectively controlled to extend the switching time interval over milliseconds, to eliminate capacitive feedthrough while performing what is hereinafter termed a "fast mix" between the audio signals. It follows that one signal is replaced by another signal without generating the undesirable transient spike. However, in a system such as used in switcher apparatus wherein as many as 16 stereo high quality audio signal inputs are common, this latter scheme is relatively cumbersome due to the fact that each of the corresponding large number of FET control signals are ramps of both increasing and decreasing magnitudes. This, in turn, necessitates the attendant complexity of multi-plexing a large number of ramp control signals. Further, the FETs must be matched to provide the optimum performance required of the mixer device. In addition, such scheme does not allow the advantageous use of present commercially available large switch matrices with built in decoding and drivers.

The present invention circumvents the problems and disadvantages generally found in typical analog audio switches while allowing the use of commercially available large switch matrices with decoding and switch drive facilities. This provides the added advantage of a relatively simple switching control circuit in systems employing large numbers of high quality audio input signals, particularly in a microprocessor controlled system. Thus the control circuitry is simplified while still retaining the silent switching provided, for example, by the soft switch technique obtained by use of a fast FET signal mixing circuit.

To this end, to obtain the above-mentioned advantages of the invention combination, at least two switch arrays are used to provide two identical matrices, with each array coupled to the multiple audio input signals. The arrays include multiple crosspoints, the number of which is dictated by the number of audio inputs and the array configuration selected. The outputs of the arrays are coupled to respective buses and thence to respective FET switches of a fast FET signal mixing circuit. The FET outputs, in turn, are connected together to provide the switch output.

Thus, it may be seen that two internal buses are used for each visible external bus. The invention contemplates switching crosspoints onto an "off-air", or "phantom", bus opposite an "on-air" bus, waiting for the transient spike to subside and then performing a fast mix between the two internal buses. In a microprocessor controlled scheme, the microprocessor remembers which internal bus was last written to, and which crosspoint was last selected on the opposite off-air bus. Thus, the invention contemplates a two-stage switching technique, utilizing the phantom array/bus configuration, wherein the new signal first is placed on the off-air array/bus and at a given time interval later, dictated generally by the switching speeds of the various components, is selected as the on-air array/bus via the FET signal mixing circuit. The prior on-air array/bus simultaneously is placed off-air.

The use of a phantom bus in combination with an on-air bus, to provide a two stage switching process which allows a transient spike and thus any associated "pop" to subside, further reduces the switch control complexity while minimizing the number of discrete components in the system. The technique also may be used to switch signals other than audio signals, i.e., video, control line, etc., signals, wherein switching transients are unacceptable.

BRIEF DESCRIPTION OF THE DRAWINGS

FIG. 1 is a simplified schematic diagram depicting a conventional fast FET signal mixing circuit.

FIGS. 2A–2E are a graph illustrating the waveforms generated by the signal mixing circuit of FIG. 1.

FIG. 3 is a simplified schematic diagram of the invention combination.

FIG. 4 is a schematic diagram depicting an implementation of the switch array circuit of FIG. 3 with attendant switch control signals.

FIG. 5 is a partial schematic diagram depicting an implementation of the associated FET signal mixing circuit of FIG. 3 with attendant switch control signals.

DESCRIPTION OF THE PREFERRED EMBODIMENTS

Referring to FIGS. 1 and 2, a generally conventional analog audio switching circuit includes a pair of FETs 12 and 14 coupled via respective inputs 16 and 18 to input signals 1 and 2 illustrated in FIGS. 2A and 2B. A corresponding pair of switch control signals 1 and 2 are supplied to the respective gate or control elements of the FETs via control lines 20, 22, and are illustrated in FIGS. 2C and 2D as simultaneously increasing and decreasing voltage ramps, respectively. The outputs of the FETs 12, 14 correspond to decreasing and increasing signal envelopes (FIG. 2E), and are coupled together at a common junction 24 to provide an output signal via an amplifier 28 and output 26 which corresponds to the input signals 1 and/or 2 as determined by the state of the FETs. During the switching interval, FET 12 ramps off while FET 14 ramps on, whereby input signal 1 is replaced by signal 2 by means of a conventional fast mix technique. The switching interval is of the order of five milliseconds, during which interval the magnitude of the input signal 1 decreases as the magnitude of signal 1 increases, as depicted in FIG. 2E.

In a system wherein a large plurality of input signals are to be switched, an additional FET stage is provided for each input signal. Thus as depicted in FIG. 1, an additional FET with a respective switch control signal must be included for each input, as indicated by numerals 30, 32, 34, and dashed line 36. Since the control signals are ramps such as depicted in FIG. 2C, 2D and since both ramps are supplied to each FET, it can readily be seen that multiplexing such control signals in a system having, for example, 16 stereo audio signals (32 channels of high quality audio) becomes extremely complex and cumbersome.

The complexity of the added FETs and associated control lines is eliminated in the invention combination of FIG. 3, wherein multiple audio input signals 1, 2, 3 and N are supplied, via inputs 38, 40, 42 and 44 respectively, to first and second switch arrays 46 and 48. The latter arrays provide identical switch matrices wherein, in a simple configuration, such as illustrated in FIG. 3, the number of switch crosspoints 50, 52, 54, 56 and 58, 60, 62, 64 of the arrays 46, 48 respectively, are dictated by the number of input signals, and the number of switch control signals, as well as the configuration of the array selected. Each matrix then includes, and is part of, first and second busses 66, 68 respectively, coupled to respective FETs 70, 72 which form a fast signal mixing circuit 74 similar to that of FIG. 1. An output signal is provided via an output 76 and a common connection of the FET outputs. Although the signal mixing circuit 74 is not a true mixer circuit, it is hereinafter termed a FET mixer circuit (74) to more readily identify and thus distinguish it from the switch arrays (46, 48).

Switch control signals in the form of digital words are provided to the switch arrays 46, 48, and particularly to the associated individual crosspoints 50-56 and 58-64 thereof, via a switch control bus 78. In turn the switch control signals are supplied, for example, by a microprocessor 80 as a digital address word whose value is indicative of the corresponding crosspoints of the arrays 46, 48. The number of bits of the address word are dictated by the size of the array, i.e., the number of crosspoints. The microprocessor further supplies first and second strobes on lines 82, 84 to the arrays 46, 48, to select the array whose crosspoint is affected. The microprocessor 80 also supplies ramp control signals via lines 86 extending to a ramp control and generator circuit 88. The latter supplies first and second FET control ramps to the FETs 70, 72 via FET control lines 90, 92. The various switch control signals supplied by the microprocessor 80 are further illustrated in FIGS. 4 and 5 below.

In operation, it is assumed that audio input signal 1 is on-air and corresponds to an output signal on output 76, supplied via the respective crosspoint in switch array 46, the bus 66 and the FET 70, in response to the switch control signal on control bus 78, the first strobe on line 82, and the FET control ramp on line 90. Thus, array 48, second bus 68 and the FET 72 define the off-air signal path, i.e., the phantom bus. At such time as input signal 1 is to be replaced by another audio signal as, for example, input signal 3, the switch control signal on control bus 78 and the second strobe on line 84 switch the crosspoint to place input signal 3 on the off-air signal path. Simultaneously, the FET control ramps on lines 90, 92 turn the FET 72 on while turning the FET 70 off, to initiate the fast mix process which replaces signal 1 with the signal 3. Since the ramps take several milliseconds to switch the FETs, and the crosspoints of the arrays are switched within microseconds, there is a sufficient time interval between the two switching stages to allow any transient spike to subside before the input signal 3 is coupled to the output 76, i.e., is placed on-air. At such time the array 48, bus 68 and FET 72 provide the on-air path, and the array 46, bus 66 and FET 70 provide an off-air path which is available for the next switch between input signals.

FIGS. 4 and 5 illustrate one implementation of the circuit of FIG. 3, wherein FIG. 4 includes four dual switch arrays 94, 96, 98 and 100. The top half of the arrays receive 16 stereo audio signals corresponding to the first, or left, channel of stereo and herein labeled AUD IN-L0 through AUD IN-L15 respectively. The lower half of the switch arrays receive 16 complementary stereo audio signals AUD IN-R0 through AUD IN-R15 corresponding to the second, or right, channel of stereo. The arrays provide four stereo signals on a bus 102, with one channel of the four signals termed AUD-LA, LA', LB, LB' and with the four complementary signals of the second channel termed AUD RA, RA', RB, RB'. The prime symbol indicate the instantaneous off-air, or phantom, bus. By way of example only, the arrays employed herein are 4 by 4 by 2 switch arrays, commercially available as a CD22101 array manufactured by RCA Corporation. In this particular embodiment, the upper half of each array receives four audio signals corresponding to the left channel of four stereo signals, and each lower half receives the four audio signals corresponding to the right channels, of the four stereo signals. With the array depicted, the switch control signal is a 4-bit digital address word supplied on the switch control bus 78. The 32 crosspoints are switched in respective channel pairs in response to the digital word, which equal the successive values zero through 15 for the respective 16 audio signals in one-half of the array, and the complementary audio signals of the other array half. Thus crosspoint XO-YO in each of left channel arrays, and the corresponding crosspoint XO-YO in each of the right channel arrays, are addressed simultaneously by the digital value zero (all inputs are "0"). Likewise, all the crosspoint pairs of both channels of the arrays are addressed simultaneously by respective digital values. To complete the switch control, an input DO on a line 104 from the microprocessor 80 supplies a high logic level to the arrays in which crosspoints are to be switched, while the selected array is strobed via a respective strobe line 106, 108, 110 or 112, to enable the crosspoint of the specific switch array. Since the operation and microprocessor control of large switch arrays as in FIG. 4 is generally known to those skilled in the art, no further description thereof is believed required herein.

FIG. 5 includes, also by way of example only, four fast FET mixer circuits 114, 116, 118, 120 similar to the signal mixer circuit 74 of FIG. 3, wherein each mixer circuit receives a respective pair of audio signals from the arrays of FIG. 4. Thus signals AUD-LA, LA', RA and RA' are supplied on respective lines 102 to the FETs in mixer circuits 114 and 116, while the signals AUD-LB, LB', RB and RB' are fed to the FETs of mixer circuits 118 and 120, as shown in FIG. 5. The FETs are selectively switched via microprocessor-generated ramp control signals supplied to a ramp control circuit 122 which is coupled in turn to a ramp generator circuit 124. The ramp control signals fed to the ramp control circuit 122 are logic levels and include a REG/PRIME signal on a line 126, a RAMP STROBE signal on a line 128 and an A/B BUS signal on a line 130. The REG/PRIME signal selects either the regular (on-air) bus or the phantom (off-air) bus, the RAMP STROBE signal is a logic level for initiating the generation of the ramps by the ramp generator 124, and A/B BUS signal selects either the A or B bus. The control signals are provided by the microprocessor 80 as depicted in FIG. 3. The circuit 122 comprises in essence a pair of flip-flops (not shown), and provides opposite logic states on lines 132, 134 coupled to the ramp generator circuit 124. The latter circuit 124 supplies FET control ramps of opposite slopes to the mixer circuits 114, 116 on respective FET control lines 136, 138. Likewise, the ramp generator circuit supplies a second pair of opposite FET control ramps to the mixer circuits 118, 120 via FET control lines 140, 142. The mixer circuit 114 is shown in schematic to illustrate an implementation of the mixer circuits 114–120 which are generally conventional in design, and accordingly are not further described herein. The stereo audio output signals AUD OUT-LA, RA, LB and RB are selectively supplied on the outputs 144, 146, 148, 150, respectively, as previously described for the single audio output signal of FIG. 3.

Although the FIGS. 4 and 5 depict the switching of stereo audio signals, the invention combination obviously contemplates the handling of various pluralities and types of audio signals, as well as other signals such as, for example, video signals, control line signals, etc. Also, various other switch array matrices and associated fast signal mixing circuits may be used as dictated by the plurality and type of signals being switched.

What is claimed is:

1. Circuit for switching between multiple input signals to provide a corresponding output signal, comprising:

signal mixer means for supplying the output signal;

first means for supplying a first input signal to the signal mixer means to provide the output signal;

second means coupled to the signal mixer means for receiving a second input signal for a preselected period of time in response to a first switching control signal; and said signal mixer means being responsive to a second switching control signal only after the preselected period of time has passed for replacing the first input signal with the second input signal.

2. The circuit of claim 1 wherein the first and second means include:

first and second switch arrays respectively; and first and second signal buses selectively coupling the respective first and second switch arrays to the signal mixer means in response to the first switching control signal.

3. The circuit of claim 2 wherein the multiple input signals are coupled to both the first and second switch arrays.

4. The circuit of claim 3 including:

switch control means for supplying the first switching control signal to the first and second switch arrays and for supplying the second switching control signal to the signal mixer means.

5. The circuit of claim 4 wherein:

the first switching control signal is a plurality of digital address words indicative of respective multiple input signals; and the second switching control signal is an analog ramp signal.

6. The circuit of claim 1 wherein;

the first means include an on-air signal bus;

the second means include an off-air signal bus; and the second input signal is switched to the off-air signal bus for the preselected period of time prior to the occurrence of the second switching control signal to allow any switching spikes in the second input signal to subside.

7. The circuit of claim 6 wherein:

the on-air signal bus includes a first switch array responsive to the first switching control signal; and the off-air signal bus includes a second switch array also responsive to the first switching control signal.

8. The circuit of claim 1 including:

switch control means for supplying the first switching control signal in the form of a series of digital address words, and the second switching control signal in the form of an analog ramp signal.

9. The circuit of claim 8 wherein:

the first and second means comprise first and second crosspoint matrices respectively; and said first and second crosspoint matrices being responsive to the digital address words for supplying the second signal through the second crosspoint matrix prior to the occurrence of the second switching control signal.

10. The circuit of claim 9 wherein the signal mixer means include a pair of transistor switches for receiving respective first and second input signals and for mixing the input signals in responsive to respective analog ramp signals.

11. Circuit for transient-free switching between first and second audio signals of a large plurality of audio signals, comprising:

first switching bus means for supplying the first audio signal;

second switching bus means for receiving the second audio signal at a first instant of time; and means for replacing the first audio signal on the first switching bus means with the second audio signal on the second switching bus means at a second instant of time which occurs a preselected time period after said first instant of time which is sufficient to allow a transient therein to subside.

12. The circuit of claim 11 wherein the means for replacing include:

signal mixer means selectively coupled to the first and second switching bus means; and switching control means for supplying a second switching control signal to the signal mixer means at the second instant of time after the preselected time period.

13. The circuit of claim 12 wherein the switching control means further supplies a first switching contol signal to th second switching bus means at the selected first instant of time.

14. The circuit of claim 11 wherein the first and second switching bus means include:
respective first and second switch arrays each coupled to the large plurality of audio signals; and
respective first and second signal buses operatively coupled to the first and second switch arrays.

15. The circuit of claim 14 wherein the means for replacing include signal mixer means selectively coupled to the first or second signal buses at the second instant of time.

16. Circuit for switching between multiple input signals to provide therefrom an output signal, comprising:
on-air signal bus means including a crosspoint matrix for receiving the multiple input signals and for providing an on-air signal as the output signal;
off-air signal bus means for receiving the multiple input signals and including a crosspoint matrix responsive to a first switching control signal to provide an off-air signal; and
signal mixer means coupled to the first and second signal bus means for initially supplying the on-air signal as the output signal and responsive to second switching control signals to replace the on-air signal with the off-air signal.

17. The circuit of claim 16 including:
switch control means for supplying the first switching control signal to the off-air signal bus means, and for thereafter supplying the second switching control signals to the signal mixer means.

18. Circuit for switching its output between multiple audio input signals without generating switching spikes, comprising:
signal mixer means for supplying an audio output signal;
an on-air signal path coupled to the multiple audio input signals for supplying one of the audio input signals to the signal mixer means to define an on-air audio output signal;
an off-air signal path coupled to the multiple audio input signals for receiving a second of the audio input signals to define an off-air audio input signal; and
switching control means coupled to the signal mixer means for replacing the on-air audio input signal with the off-air audio input signal to provide a new audio output signal.

19. A method for switching between multiple input signals while eliminating any transient switching spikes, comprising:
supplying one of the input signals to define a first on-air signal;
switching a second of the input signals to define an off-air signal state for a selected time period to allow any switching spike to subside; and
mixing the first on-air signal with the off-air signal only after the selected time period has passed to provide the second input signal as a new on-air signal replacing the first on-air signal.

20. The method of claim 19 wherein the steps further comprise:
supplying the first on-air signal to a first on-air bus;
generating a digital switch control signal;
switching the second input signal to an off-air bus in response to the digital switch control signal; and
fast switching between the first on-air bus and the off-air bus to replace the first on-air signal with the seond input signal.

21. The method of claim 20 further including:
generating an analog ramp switch signal; and
applying the analog ramp switch signal to fast switch between the first on-air bus and the off-air bus.

* * * * *